United States Patent [19]

Shima

[11] Patent Number: 5,021,693
[45] Date of Patent: Jun. 4, 1991

[54] CONTROL CIRCUIT FOR FLOATING GATE FOUR-QUADRANT ANALOG MULTIPLIER

[75] Inventor: Takeshi Shima, Sagamihara, Japan

[73] Assignee: Kabushiki Kaisha Toshiba, Kawasaki, Japan

[21] Appl. No.: 500,309

[22] Filed: Mar. 28, 1990

[30] Foreign Application Priority Data

Apr. 5, 1989 [JP] Japan .................................. 1-84705

[51] Int. Cl.$^5$ ........................ H03K 5/22; H03K 19/08
[52] U.S. Cl. .................................... 307/494; 307/201; 364/807
[58] Field of Search .............. 307/495, 570, 494, 530, 307/201; 365/185, 207, 208; 364/807; 357/25.5

[56] References Cited

U.S. PATENT DOCUMENTS

| | | | |
|---|---|---|---|
| 4,663,740 | 5/1987 | Ebel | 357/23.5 |
| 4,950,917 | 8/1990 | Holler et al. | 307/201 |
| 4,956,564 | 9/1990 | Holler et al. | 307/201 |
| 4,961,002 | 10/1990 | Tam et al. | 307/201 |

OTHER PUBLICATIONS

U. Rueckert et al., "VLSI Architectures for Associative Networks", International Symposium on Circuits and Systems Proceedings, vol. 1, Jun. 7-9, 1988, pp. 755-758, IEEE.

Mark Holler et al., "An Electrically Trainable Artificial Neural Network (ETANN) with 10240 'Floating Gate' Synapses", IJCNN International Joint Conference on Neural Networks, 1989, pp. II-191-II-196.

Primary Examiner—David Hudspeth
Assistant Examiner—Toan Tran
Attorney, Agent, or Firm—Foley & Lardner

[57] ABSTRACT

Disclosed is an electronic circuit comprising commonly connecting the gate end of a first transistor having a floating gate and the source end and the drain end of a second transistor having a floating gate to a first control input terminal, and commonly connecting the source end and the drain end of the first transistor and the normal gate end of the second transistor to a second control input terminal. The electronic circuit can repeatedly set and maintain accumulation charge amounts of the respective floating gates of the first and the second transistor at predetermined values. Also disclosed is an electronic circuit including the above electronic circuit, and further comprising commonly connecting the respective souce ends of a third and a fourth transistor to a first terminal to compose a first differential couple, providing a current source between the first terminal and a power source end or and earthed end, connecting the floating gates of the first and the third transistor together, connecting the floating gates of the second and the fourth transistor together, connecting the normal gate end of the third transistor to a first positive input terminal, and connecting the normal gate end of the fourth transistor to a first negative input terminal. The so-composed electronic circuit can repeatedly set and maintain threshold values in differential amplification at respective predetermined values. Further disclosed is an analog multiplication circuit comprising combination of these electronic circuits and an amplification circuit, which can repeatedly set and maintain weight concerning multiplication factors at predetermined values.

8 Claims, 4 Drawing Sheets

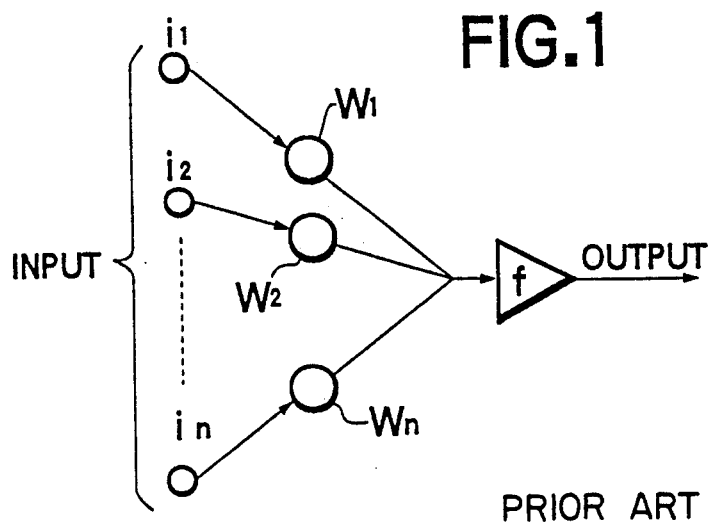
FIG.1
PRIOR ART
FIG.2
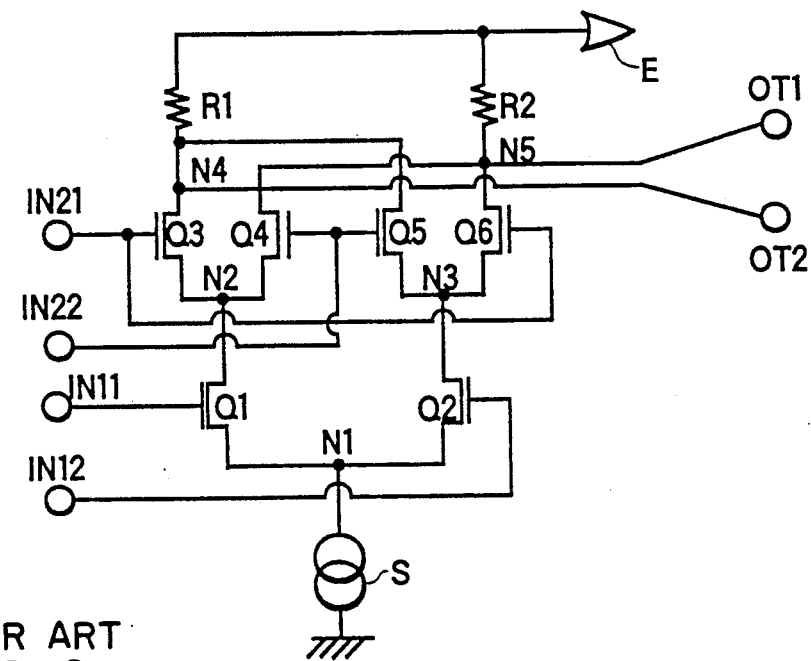
PRIOR ART
FIG.3
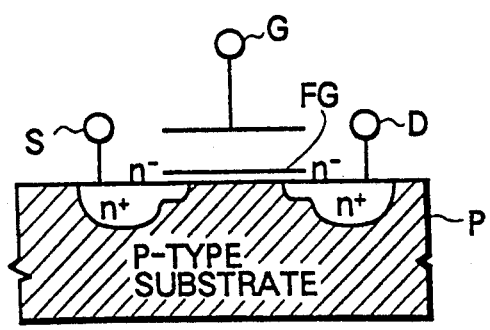
PRIOR ART
FIG.4
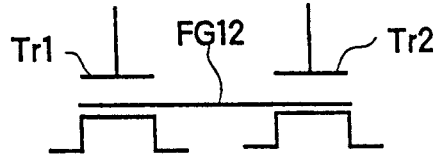

CONTROL CIRCUIT FOR FLOATING GATE FOUR-QUADRANT ANALOG MULTIPLIER

BACKGROUND OF THE INVENTION

1. Field of the Invention

The present invention relates to an electronic circuit which can repeatedly set and maintain accumulation charge amounts of respective floating gates at respectively predetermined values, a differential amplification electronic circuit which can control threshold values at respectively predetermined values by using the electronic circuit, and an analog multiplication electronic circuit which can freely control multiplicaton factors by using the differential amplification electronic circuit.

2. Description of the Prior Art.

In analog multiplication circuit for performing a multiplicaton of A×B, when the circuit has a function for setting and maintaining the multiplication factor A at a predetermined value, it is possible to express a synapse connection in a nerve system of a living body in a form of an electronic circuit by using the analog multiplication circuit.

Generally, a nerve cell has a directional property, it transmits output of another cell on one side of the nerve cell to still another cell on the other side thereof. In this case, each cell multiplies input i1, i2, ... in from several other cells shown in FIG. 1 by weight w1, w2, ... wn to set weight on the input, thereafter the total sum of these products is obtained, then the output is finally determined in accordance with the result. Further, the output has a saturation characteristic at both the top and the bottom thereof.

The output of the nerve cell is expressed by the following equation:

$$\text{output} = f[\Sigma(\text{weight}) \times (\text{input})]$$

where f is a monotonously increasing odd function having a saturation characteristic.

Namely, in the expression of the nerve cell in a form of an electronic circuit, a multiplication circuit for the analog input of (weight) and (input) is required.

Conventionally, as an analog multiplication circuit for such expression of the nerve cell in a form of an electronic circuit, a gilbert multiplier as shown in FIG. 2 is well known.

In the conventional analog multiplication circuit, the respective source ends of a pair of a first and a second transistor Q1, Q2 are commonly connected to a first terminal N1 to compose a first differential couple, and a current source S is also connected to the first terminal N1. While, the respective source ends of a pair of a third and a fourth transistor Q3, Q4 are commonly connected to a second terminal N2 to compose a second differential couple, and the respective source ends of a pair of a fifth and a sixth transistor Q5, Q6 are commonly connected to a third terminal N3 to compose a third differential couple. Moreover, the second terminal N2 is connected to the drain end of the first transisitor Q1 and the third terminal N3 is connected to the drain end of the second transistor Q2. The drain ends of the third and the fifth transistor Q3, Q5 are commonly connected to the fourth terminal N4, and a power source E is also connected to the fourth terminal N4 through a resistor R1. Furthermore, the drain ends of the fourth and the sixth transistor Q4, Q6 are commonly connected to the fifth terminal N5, and the power source E is also connected to the fifth terminal N5 through a resistor R2. The normal gate end of the first transistor Q1 is connected to a first positive input terminal IN11, and the normal gate end of the second transistor Q2 is connected to a first negative input terminal IN12. Further, the normal gate ends of the third and the sixth transistor Q3, Q6 are commonly connected to a second positive input terminal IN12, and the normal gate ends of the fourth and the fifth transistor Q4, Q5 are commonly connected to a second negative input terminal IN22. Moreover, a fifth terminal N5 is connected to a positive output terminal OT1, and a fourth terminal N4 is connected to a negative output terminal OT2.

In the conventional analog multiplication circuit having such composition, a multiplication result between first input which is complementary signal given to the first positive input terminal IN11 and the first negative input terminal IN12 and second input which is another complementary signal given to the second positive input terminal IN21 and the second negative input terminal IN22 appears as a complementary output at the positive output terminal OT1 and the negative output terminal OT2.

Accordingly, the conventional analog multiplication circuit can perform the multiplication of (weight)×(input), however, when the first input to the input terminals IN11, IN12 is removed, the influence appears on the output terminals OT1, OT2, so that the multiplication result is changed immediately.

Moreover, though the weight in the nerve cell is changed on a learning state and maintained for a long time in a store state in general, and the function is necessary for the expression of the nerve cell in a form of a electronic circuit, it is difficult for the gilbert multiplier to change the weight of learning and maintain it on storage.

While, in the prior art, a storage circuit including a transistor having a floating gate is known as a circuit for changing the state and maintaining it after changed.

FIG. 3 is a compositional cross sectional diagram of a transistor having such a floating gate. The transistor has a source end S, a drain end D and a control gate end G on a p-type substrate P thereon, and a floating gate FG extremely close to the substrate P as an interval of, for example, about 100 Å.

In case of the transistor, storage of information is carried out as follows. When the source end S is earthed, and the control gate end G is applied with a high voltage, electrons move from the source end S to the floating gate FG. This is a tunnel current called a Fowler-Nordheim current. Accordingly, the floating gate FG is charged negatively, and a phenomenon equivalent to that threshold values of a MOS transistor composed of the control gate end G, the source end S and the drain end D are increased appears. Generally, even in the case that the source end S and the control gate end G are returned into a normal voltage condition, the threshold values are maintained for a long time.

While, when a high voltage is applied to the source end S, and the control gate end G is earthed, the Fowler-Nordheim current flows in the reverse direction to that mentioned above, so that electrons can be pulled out from the floating gate FG. Accordingly, the threshold values of the MOS transistor composed of the control gate end G, the source end S and the drain end D are decreased.

However, the transistor having such a floating gate is used only for a memory integrated circuit called EEPROM capable of rewriting and a process to correct scattering of the threshold values of a MOS transistor caused on production thereof, in which transistors Tr1, Tr2 having a pair of floating gates FG12 are used so that an accumulation charge amount of the floating gate FG12 is controlled by the transistor Tr1 to change the threshold value of the other transistor Tr2, as shown in FIG. 4.

As stated above, in the conventional analog multiplication circuit having composition like a nerve cell expressed in a form of an electronic circuit, such an electronic circuit that can set and maintain the weight at a predetermined value, further repeatedly perform operation for setting and maintaining the value is not known. Moreover, as an example in which the transistor having the floating gate is used for multiplication operation in the synapse [1], [2], only the conventional examples shown in FIGS. 3 and 4 are known.

[1] U. Rückert and K. Goser, "VLSI Architectures for Assosiative Networks", INTERNATIONAL SYMPOSIUM ON CIRCUITS AND SYSTEMS PROCEEDINGS Volume 1 of 3, Jun. 7-9, 1988, pp. 755-758, IEEE.

[2] Mark Holler, Simon Tam, Hernan Castro, Ronald Benson, "An Electrically Trainable Artifical Neural Network (ETANN) with 10240 'Floating Gate' Synapses", IJCNN INTERNATIONAL JOINT CONFERENCE ON NEURAL NETWORKS, pp. II-191-II-196, IEEE, 1989.

SUMMARY OF THE INVENTION

The present invention is invented in the light of the above-mentioned problems of the prior art. It is therefore an object to provide an electronic circuit which can control an accumulation charge amount of a floating gate by using a feature of a transistor having the floating gate, a differential amplification electronic circuit which can control threshold values by using the electronic circuit, and an analog multiplication electronic circuit which can rewrite weight in a multiplication operation of (weight)×(input) by using the differential amplification electronic circuit, and maintain weight once rewritten for a long time or semipermanently, and repeatedly perform these operation.

In a first embodiment of an electronic circuit of the present invention, the normal gate end of a first transistor having a floating gate, the source end and the drain end of a second transistor having a floating gate are commonly connected to a first control input terminal, and the source end and the drain end of the first transistor and the normal gate end of the second transistor are connected to a second control input terminal, so that respective accumulation charge amount of the floating gates of the first and the second transistor can be controlled by control input respectively given to the first and the second input terminal.

In the electronic circuit of the embodiment, when an electric potential for control input to be applied to the first control input terminal is biased higher than that to be applied to the second control input terminal, and is set at a level which flows the Fowler-Nordheim current, electrons move into the floating gate of the first transistor, and at the same time, electrons are pulled out from the floating gate of the second transistor. On the contrary, when an electric potential for control input to be applied to the second control input terminal is biased higher than that to be applied to the first control input terminal, and is set at a level which flows the Fowler-Nordheim current, electrons move into the floating gate of the second transistor, while electrons are pulled out from the floating gate of the first transistor. Thus, amounts of electric charge accumulated in the respective floating gates can be complementarily changed by applying complementary signals for the first and the second control input between the first and the second transistor. Moreover, the charge amount once accumulated can be maintained until the next control signals are applied. Therefore, the electronic circuit can be used for setting weight on input signals in an electronic circuit to express a nerve cell.

In a second embodiment of an electronic circuit of the present invention, an electronic circuit similar to the first embodiment is included, and the respective source ends of a pair of a third and fourth transistor having floating gates are commonly connected to a first terminal, and a current source is provided between the first terminal and a power source or an earthed end. Moreover, the floating gates of the first and the third transistor are connected together, while the floating gates of the second and the fourth transistor are connected together. The normal gate of the third transistor is connected to a first positive input terminal, while the normal gate of the fourth transistor is connected to a first negative input terminal.

According to the electronic circuit of the embodiment, electric charge respectively accumulated in the floating gates of the first and the second transistor is given to the floating gates of the third and the fourth transistor respectively, so that threshold values of a differential couple composed of the third and the fourth transistor are set.

Then, amounts of electric charge accumulated in the floating gates of the first and the second transistor can be maintained at predetermined values until next control input is given to the first and the second input control terminal so that the threshold values of the differential couple are maintained at predetermined values. While, when alteration of the threshold value is required, by applying complementary signals for the first control input and the second control input respectively corresponding to the first and the second transistor to the first and the second control input terminal, the threshold values can be set or altered anew.

As stated above, according to the electronic circuit of the embodiment, the differential amplification characteristic can be controlled by controlling the control input to be given to the first and the second control input terminal respectively corresponding to the first and the second transistor, the branch ration of current to be flowed in the third and the fourth transistor can be repeatedly set and maintained at a predetermined value, and control of the branch ration of current can be correctly carried out without causing direct current offset.

The electric circuit of the embodiment, for example, can be used as a setting circuit for setting weight on input signals in an electronic circuit commensurate to the analog multiplication circuit to expression a nerve cell.

In a third embodiment of an electronic circuit of the present invention, the electronic circuit of the second embodiment is included, and the respective source ends of a pair of a fifth and sixth transistor are commonly connected to a second terminal to compose a second differential couple. The second terminal of the second differential couple is connected to the drain end of the third transistor. While, the respective source ends of a pair of a seventh and an eighth transistor are commonly connected to a third terminal to compose a third differential couple, and the third terminal of the third differential couple is connected to the fourth drain end of the fourth transistor. Moreover, the respective normal gate ends of the fifth and the eighth transistor are commonly connected to a second positive input terminal, and the respective normal gate ends of the sixth and the seventh transistor are commonly connected to a second negative input terminal. Furthermore, the respective drain ends of the fifth and the seventh transistor are commonly connected to a positive output terminal, and the respective drain ends of the sixth and the eighth transistor are commonly connected to a negative output terminal.

Accordingly, in the electronic circuit of the third embodiment, since threshold values of the third and the fourth transistor respectively composing the first differential couple can be changed by alteration of an accumulation charge amount corresponding to the floating gates of the first and the second transistor, the amplification characteristic can be changed by alerting the threshold values corresponding to a first complementary input signal to be given to the first positive input terminal and the first negative input terminal. Then, an amplification signal of the drain end of the third transistor in the first differential couple is given to the second terminal in the second differential couple, and further amplified by the fifth and the sixth transistor in the second differential couple. At the same time, an amplification signal of the drain end of the fourth transistor in the first differential couple is given to the third terminal in the third differential couple, and further amplified by the seventh and the eighth transistor in the third differential couple.

The amplification characteristics of the second and the third differential couple can be controlled by a second positive input and a second negative input to be applied to the respective normal gates of the transistors respectively composing the differential couples, finally, complementary signals as a result of multiplication of the first input and the second input can be obtained between the positive output terminal and the negative output terminal.

In order to make an electronic circuit to express a nerve cell using the analog multiplication electronic circuir, when the first positive input terminal and negative input terminal are biased an equal voltage, and the branch ratio of currents to flow in the drain end of the third transistor and the drain end of the fourth transistor are set as weight, the weight can be changed by alteration of the threshold valued, further the threshold value can be changed by signals to be applied to the first and the second control input respectively corresponding to the first and the second transistor. Therefore the weight can be altered by applying the control input signals to the first and the second control input terminal, while when the alteration is not required, a constant accumulation charge can be alway maintained in the floating gate by removing the control input signals as well as the threshold values can be maintained constantly. Accordingly, only when the alteration of the weight is required, the predetermined first control input and second control input can be applied to the first and the second transistor respectively. In case that the circuit diagram is used as a weight setting circuit for a nerve cell, the setting, maintenance and alteration of the weight can be easily performed, and the control of these processed can be also easily performed, further the circuit can be composed with ease.

These and other objects, features and advantages of the present invention will be more apparent from the following description of preferred embodiments, taken in conjunction with the accompanying drawing.

BRIEF DESCRIPTION OF THE DRAWINGS

FIG. 1 is an electronic circuit diagram of a general nerve cell,

FIG. 2 is a circuit diagram of a normal analog multiplication circuit.

FIG. 3 is a compositional diagram of a transistor having a normal floating gate, FIG. 4 is a circuit diagram to show how to use a transistor having a floating gate.

DETAILED DESCRIPTION OF THE EMBODIMENTS

Hereinafter, embodiments of the present invention will be described with reference to the drawings.

Figure 5:
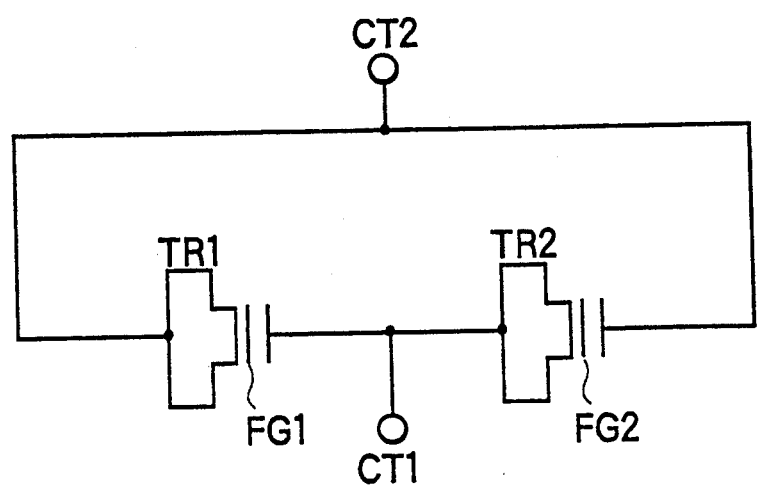
FIG. 5 is a circuit diagram of an electronic circuit which is a first embodiment of the present invention.

FIG. 5 shows a circuit diagram of an electronic circuit which is a first embodiment of the presentinvention. In the same drawing, the normal gate end of a first transistor TR1 having a floating gate FG1 and the source and drain ends of a second transistor TR2 having a floating gate FG2 are commonly connected to a first control imput terminal CT1, and the source and drain ends of the first transistor TR1 and the normal gate end of the second transistor TR2 are commonly connected to a second control input terminal CT2.

Figure 6:
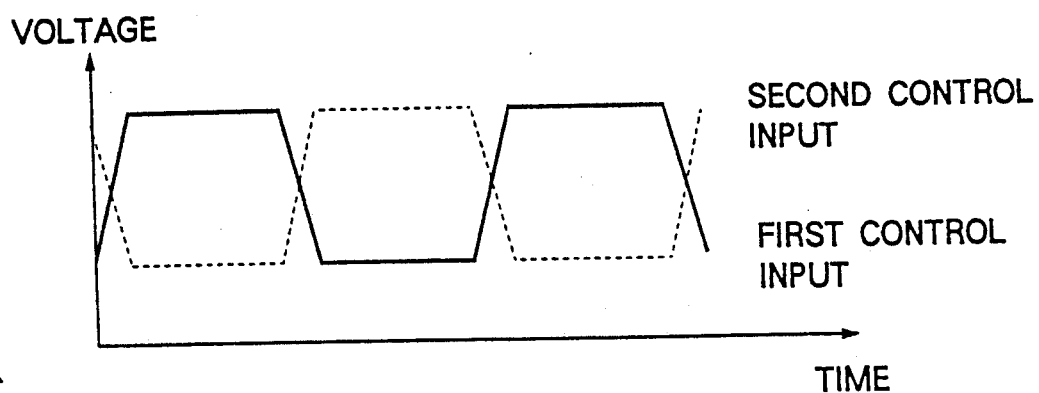
FIG. 6 is a diagram to show control input of the electronic circuit of the first embodiment shown in FIG. 5.

Then, when control input as shown in FIG. 6 is given to the first and the second control input terminal CT1, CT2 respectively, an electric potential of the first control input terminal CT1 is biased higher than that of the second control input terminal CT2 at first. Moreover, when the condition that the Fowler-Nordheim current flows is satisfied, while electrons move into the first floating gate FG1 of the transistor TR1, and at the same time, electrons are pulled out from the floating gate FG2 of the transistor TR2. On the contrary, when an electric potential of the second control input terminal CT2 is biased higher than that of the first control input terminal CT1, electrons move into the floating gate FG2 of the second transistor TR2, and while electrons are pulled out from the floating gate FG1 of the first transistor TR1. Namely, when complementary signals are applied to the first and the second control input terminal CT1, CT2, amounts of charge accumulated in the floating gates FG1, FG2 of the first and the second transistor TR1, TR2 can be complementarily changed in accordance with the control input. Moreover, after predetermined charge in once accumulated in the respective floating gates FG1, FG2 of the transistors TR1, TR2 by the first and the second control input in such manners, the accumulated charge is maintained until new control input is given even when the control input terminals CT1, CT2 are removed from the circuit.

Figure 7:
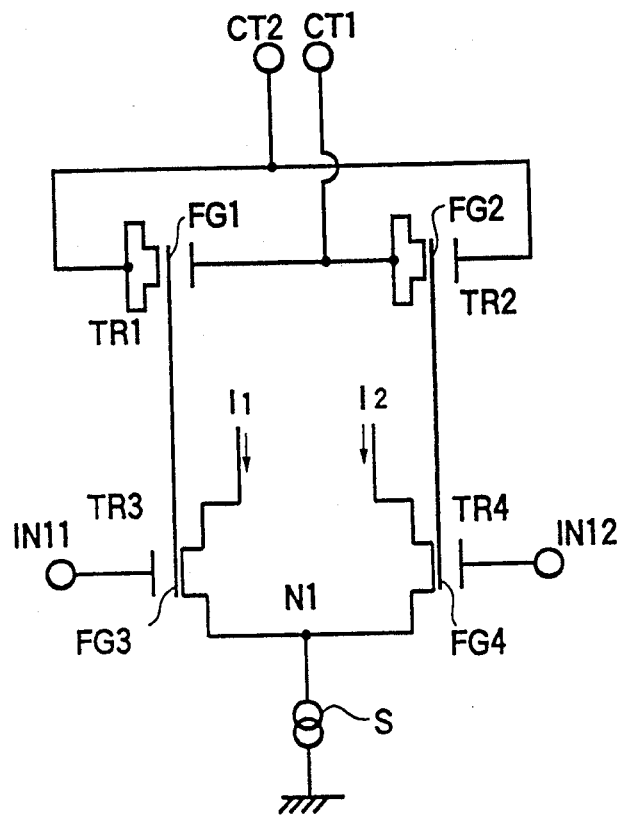
FIG. 7 is a circuit diagram of an electronic circuit for performing differential amplification, which is a second embodiment of the present invention.

FIG. 7 shows a circuit diagram of an electronic circuit for performing differential amplification, which is a second embodiment of the present invention. This embodiment includes the circuit comprising the first and the second transistor TR1, TR2 respectively having the floating gates FG1, FG2 shown in FIG. 5, and further includes a third and a fourth transistor TR3, TR4 to compose a differential couple.

The source ends of the transistors TR3, TR4 are connected together at a first terminal N1, and between the first terminal N1 and an earthed end, a current source S is connected. Moreover, floating gates FG3, FG4 of these transistors TR3, TR4 are respectively connected to the floating gates FG1, FG2 of the first and the second transistor TR1, TR2.

Furthermore, the normal gate end of the third transistor TR3 is connected to a first positive input terminal IN11, and the normal gate end of the fourth transistor TR4 is connected to a first negative input terminal IN12 so that complementary signals are inputted into the input terminals IN11, IN12.

In the differential amplification electronic circuit having the above-mentioned composition, in order to set threshold values Vth1, Vth2, accumulation charge amounts in the floating gates FG1, FG2 of the first and the second transistor TR1, TR2 are respectively controlled by control signals applied to the first control input terminal CT1 and the second control input terminal CT2 of the electronic circuit.

Then, charge amounts to be given to the floating gates FG3, FG4 of the transistors TR3, TR4 respectively connected to the floating gates FG1, FG2 of the transistors TR1, TR2 are changed by the control of the amounts of charge accumulated in the floating gates FG1, FG2. Thereafter, the threshold values Vth1, Vth2 are changed by the change of charge accumulated in the floating gates FG3, FG4 of these transistors TR3, TR5.

When, the first positive input terminal IN11 and the first negative input terminal IN12 in FIG. 7 are biased at an equal potential, and threshold values of the third transistor TR3 and the fourth transistor TR4 dare Vth1, Vth2, the source currents I1, I2 thereof are expressed as follows:

$$I1 = \beta(Vgs - Vth1)^2$$

$$I2 = \beta(Vgs - Vth2)^2$$

where $\beta$ is constant, and Vgs is a gate-source potential of the respective transistors TR3, TR4.

In the situation, when the accumulation charge amount of the floating gate FG1 of the first transistor TR1 is increased, the threshold value Vth1 of the third transistor TR3 is elevated, while the threshold value Vth2 of the fourth transistor TR4 is decreased if these transistors are n-type transistors. As the result, the branch ratio for the third transistor TR3 is lowered, while the branch ratio for the fourth transistor TR4 is elevated. Then, the differential amplification characteristic can be changed by the change of the branch ratios for the transistors TR3, TR4. Accordingly, the differential amplification characteristic can be repeatedly set and maintained at a predetermined value by the control input applied to the first control input terminal CT1, the second control input terminal CT2.

Figure 8:
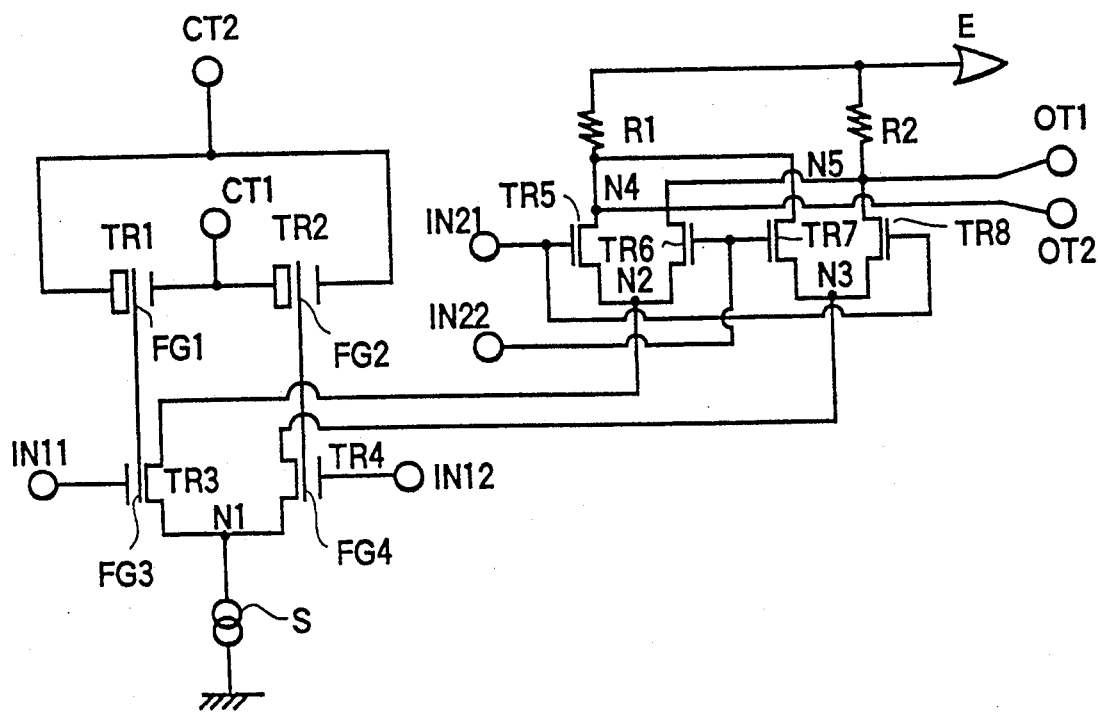
FIG. 8 is a circuit diagram of an electronic circuit for performing an analog multiplication operation, which is a third embodiment of the present invention.

FIG. 8 shows an electronic circuit diagram for performing analog multiplication operation, which is a third embodiment of the present invention, and the analog multiplication operation electronic circuit includes the differential amplification electronic circuit shown in FIG. 7 as a compositional element. In the same diagram, the first and the second transistor TR1, TR2 are connected in the same manner as shown in the electronic circuit of the first embodiment in FIG. 5. Then, the third and the fourth transistor TR3, TR4 for composing the differential couple are connected in the same manner as shown in the electronic circuit of the second embodiment in FIG. 7. Thereby, a differential amplification electronic circuit is composed. Moreover, the respective source ends of a pair of a fifth and a sixth transistor TR5, TR6 are commonly connected to a second terminal N2 to compose a differential couple, and the drain end of the third transistor TR3 is connected to the second terminal N2. While, the source ends of a pair of a seventh and an eighth transistor TR7, TR8 are commonly connected to a third terminal N3 to compose a differential couple, and the drain end of the fourth transistor TR4 is connected to the third terminal N3.

Incidentally, the drain ends of the fifth and the seventh transistor TR5, TR7 are commonly connected to a fourth terminal N4, the drain ends of the sixth and the eighth transistor TR6, TR8 are commonly connected to a fifth terminal N5.

These fourth and fifth terminals N4, N5 are connected to a power source E through resistors R1, R2 and a positive output terminal OT1 and a negative output terminal OT2 are connected to the terminals N4, N5. When, the resistors R1, R2 are removed from here, the positive and negative output terminals OT1, OT2 serve as current output terminals.

Moreover, the normal gates of the fifth and the eighth transistor TR5, TR8 are commonly connected to a second positive input terminal IN21, and the normal gates of the sixth and the seventh transistor TR6, TR7 are commonly connected to a second negative input terminal IN22.

In the analog multiplication electronic circuit of the third embodiment having the above-mentioned composition, a predetermined bias potential is given to the first control input terminal CT1 and the second control input terminal CT2 at first to accumulate electric charge in the respective floating gates FG1, FG2 of the first and the second transistor TR1, TR2. Thus, as described in the differential amplification electronic circuit in FIG. 7, the branch ratios of the third and the fourth transistor TR3, TR4 are determined by setting the threshold values Vth1, Vth2 of the transistors TR3, TR4 at predetermined values, and the first positive input terminal IN11 and the first negative input terminal IN12 are set at an equal potential.

Then the resultant current I1, I2 obtained from the differential amplification circuit are amplified by the fifth to eighth transistors TR5 to TR8 changeable corresponding to positive and negative input respectively given from the second positive input terminal IN21 and the second negative input terminal IN22. Thereafter, voltages at the fourth terminal N4 and the fifth terminal N5 are detected at the output terminals OT1, OT2.

These voltages correspond to a multiplying product of the branch ratio in the differential amplification circuit and the positive input to the seconds positive input terminal IN21 based on the second negative input given to the second negative input terminal IN22 can be obtained in accordance with the operational principle of the gilbert multiplier.

Figure 9:
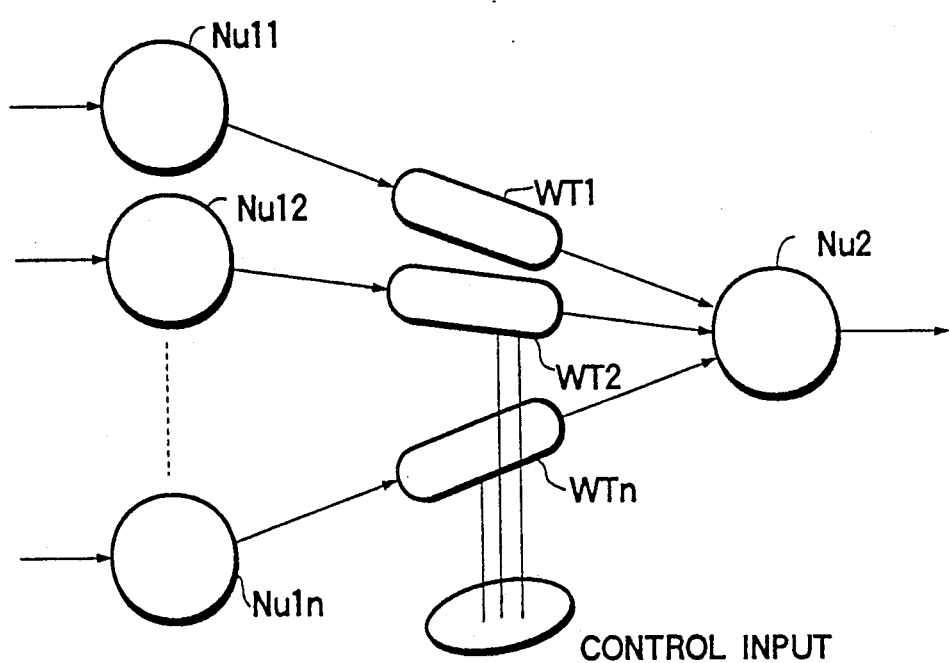
FIG. 9 is an electronic circuit diagram of a nerve cell for which the electronic circuit of the third embodiment shown in FIG. 8 is used as a weight setting circuit for the nerve cell.

When the analog multiplication electronic circuit as mentioned above is used for the expression of a nerve cell, the circuit can be used as a weight setting circuit for respectively multiplying output from several nerve cells Nu11, Nu12, . . . , Nu1n by weight WT1, WT2, . . . , WTn then obtaining the total sum of the respective products as shown in FIG. 9, and inputting the result to another nerve cell Nu2. Namely, the output from the respective nerve cells Nu11, Nu12, . . . , Nu1n is inputted to the second positive input terminal IN21 and the second negative input terminal IN22 of the analog multiplication circuit respectively. In this case, the first positive input terminal IN11 and the first negative input terminal IN12 are biased at an equal potential, further a weight setting circuit (not shown) is connected to the first control input terminal CT1 and the second control input terminal CT2 to give complementary control signals as shown in FIG. 6 to the circuit. According to such circuit composition, when alteration of weight is required, the branch ratios in the differential amplification circuit are changed by newly giving predetermined control signals to the first control input terminal CT1 and the second input control terminal CT2 from the weight setting circuit. As the result, the weight can be altered by alteration of factors in the multiplication circuit. While, when the weight is once set by the control input, the weight can be maintained until the alteration is required even when the control input is removed.

Moreover, in the embodiments shown in FIGS. 7 and 8, if required, the normal gates of the transistors TR3, TR4 may be removed. In this case, a bias circuit to be connected to the terminals IN11, IN12 can be omitted.

Additionally, though the gilbert multiplier is used in the above embodiments, it is possible to use another type of multiplier, for example a variable transconductance amplifier.

Various modification will become possible for those skilled in the art after receiving the teachings of the present disclosure without departing from the scope thereof.

What is claimed is:

1. An electronic circuit, comprising:
a first transistor having a floating gate;
a second transistor having a floating gate;
commonly connecting the normal gate end of the first transistor and the source end and the drain end of the second transistor to a first control input terminal; and
commonly connecting the source end and the drain end of the first transistor and the normal gate end of the second transistor to a second control input terminal, so that accumulation charge amounts in the respective floating gates of the first and the second transistor can be controlled by controlling input to be given to the first and the second control input terminal.

2. A differential amplification circuit, comprising:
commonly connecting the normal gate end of a first transistor having a floating gate and the source end and the drain end of a second transistor having a floating gate to a first control input terminal;
commonly connecting the source end and the drain end of the first transistor and the normal gate end of the second transistor to a second control input terminal;
commonly connecting the respective source ends of a third and a fourth transistor respectively having floating gates to a first terminal to compose a first differential couple;
providing a current source between the first terminal and a power source end or an earthed end;
connecting the floating gates of the first and the third transistor together;
connecting the floating gates of the second and the fourth transistor together;
connecting the normal gate end of the third transistor to a first positive input terminal; and
connecting the normal gate of the fourth transistor to a first negative input terminal.

3. An analog multiplication circuit, comprising:
commonly connecting the normal gate end of a first transistor having a floating gate and the source end and the drain end of a second transistor having a floating gate to a first control input terminal;
commonly connecting the source end and the drain end of the first transistor and the normal gate end of the second transistor to a second control input terminal;
commonly connecting the respective source ends of a third and a fourth transistor respectively having floating gates to a first terminal to compose a first differential couple;
providing a current source between the first terminal and a power source end or an earthed end;
connecting the floating gates of the first and the third transistor together;
connecting the floating gates of the second and the fourth transistor together;
connecting the normal gate end of the third transistor to a first positive input terminal;
connecting the normal gate of the fourth transistor to a first negative input terminal;
commonly connecting the source ends of a pair of a fifth and a sixth transistor to a second terminal to compose a differential couple;
also connecting the drain end of the third transistor to the second terminal;
commonly connecting the source ends of a seventh and an eighth transistor to a third terminal to compose a third differential couple;
also connecting the drain end of the fourth transistor to the third terminal;
commonly connecting the respective normal gates of the fifth and the eighth transistor to a second positive input terminal;
commonly connecting the respective normal gates of the sixth and the seventh transistor to a second negative input terminal;
commonly connecting the respective drain ends of the fifth and the seventh transistor to a positive output terminal; and
commonly connecting the respective drain ends of the sixth and the eighth transistor to a negative output terminal.

4. An electron circuit according to claim 1, wherein the first and the second transistor are respectively composed of a MOS transistor.

5. A differential amplification circuit according to claim 2, wherein
the first, the second, the third and the fourth transistor are respectively composed of a MOS transistor.

6. An analog multiplication circuit according to claim 3, wherein
the first, the second, the third and the fourth transistor are respectively composed of a MOS transistor.

7. A differential amplification circuit according to claim 2, wherein
the third and the fourth transistor are composed of a transistor without the normal gate end.

8. An analog multiplication circuit according to claim 3, wherein
the third and the fourth transistor are composed of a transistor without the normal gate end.

* * * * *